United States Patent [19]
Iyer et al.

[11] Patent Number: 6,130,579
[45] Date of Patent: Oct. 10, 2000

[54] FEED-FORWARD BIASING FOR RF AMPLIFIERS

[75] Inventors: Nathan R. Iyer, Greensboro; Michael R Kay, Summerfield, both of N.C.

[73] Assignee: RF Micro Devices, Inc., Greensboro, N.C.

[21] Appl. No.: 09/277,890

[22] Filed: Mar. 29, 1999

[51] Int. Cl.$^7$ .................................................. H03G 3/10
[52] U.S. Cl. ............................................ 330/285; 330/133
[58] Field of Search .................................. 330/133, 134, 330/136, 285

[56] References Cited

U.S. PATENT DOCUMENTS

| | | | |
|---|---|---|---|
| 2,930,987 | 3/1960 | Groce et al. | 330/136 |
| 3,158,818 | 11/1964 | Plumpe | 330/29 |
| 4,188,587 | 2/1980 | Palmer | 330/136 |
| 4,377,788 | 3/1983 | Christopher et al. | 330/136 |
| 5,432,473 | 7/1995 | Mattila et al. | 330/133 |
| 5,483,198 | 1/1996 | Nunn | 330/279 |
| 5,493,255 | 2/1996 | Murtojarvi | 330/296 |
| 5,517,684 | 5/1996 | Fujita et al. | 455/234.2 |
| 5,559,471 | 9/1996 | Black | 330/277 |
| 5,578,961 | 11/1996 | Fajen et al. | 327/543 |
| 5,670,911 | 9/1997 | Hori et al. | 330/277 |
| 5,703,424 | 12/1997 | Dorman | 310/90.5 |
| 5,710,519 | 1/1998 | McCalpin et al. | 327/538 |
| 5,923,215 | 7/1999 | Hans | 330/149 |
| 5,955,921 | 9/1999 | Ide et al. | 330/254 |

OTHER PUBLICATIONS

Francois Hebert, et al., "Improving Wireless Amplifier Performance with BiASIC Technology" article, Applied Microwave & Wireless, Jul./Aug. 1998, pp. 74, 76, 78, and 79.
Motorola website printout; PMOS Transistor, Nov. 19, 1998.

*Primary Examiner*—Robert Pascal
*Assistant Examiner*—Henry Choe
*Attorney, Agent, or Firm*—Rhodes & Mason, P.L.L.C.

[57] ABSTRACT

Bias circuitry is configured to adjust bias current to one or more power amplifier stages based upon the level of the RF signal to be amplified. A feed-forward circuit senses the input power level of the signal to be amplified and dynamically adjusts the bias current for one or more amplifiers in the amplification path to ensure each amplifier is operating in a linear region for the given signal level. For amplifier configurations having multiple amplification stages, the bias circuitry provides proportional bias currents to each stage as necessary for the progressively increasing signal levels being amplified. The bias circuitry eliminates excessive quiescent bias currents that prior biasing techniques required to ensure linear operation by automatically increasing bias currents only as needed based on the effective magnitude of the RF signal to be amplified.

29 Claims, 5 Drawing Sheets

FEED-FORWARD BIASING FOR RF AMPLIFIERS

FIELD OF THE INVENTION

The invention relates in general to a bias circuit and, in particular, to a dynamically controllable bias circuit for radio frequency (RF) power amplifiers.

BACKGROUND OF THE INVENTION

Radio frequency power amplifiers are used in numerous wireless communication applications. Many of these applications are in the field of consumer electronics, which are portable and require batteries. Although battery technology has advanced significantly in recent years, battery powered communication devices require maximum power efficiency for transmission of RF signals while using as little energy as possible.

Current wireless systems have increasing power amplifier linearity requirements to minimize adjacent and alternate channel distortion. A commonly applied technique to improve the linearity of RF power amplifiers is to increase their quiescent current so that the transistors forming the amplifier operate in a more linear portion of the current-to-voltage (i/v) curve. Unfortunately, increasing the quiescent current of the amplifier requires the amplifier to constantly operate at a high idle current even when small input signals do not demand the same linearity as larger inputs. Thus, there is a need for a bias current control technique that automatically adjusts bias currents based on the effective magnitude of the input signal being amplified to meet linearity requirements as well as maximize operating efficiency.

SUMMARY OF THE INVENTION

The present invention fulfills this need by providing bias circuitry configured to adjust bias current to one or more power amplifier stages based upon the level of the input signal. A feed-forward circuit senses the input power level of the input signal and dynamically adjusts the bias current for one or more amplifiers in the amplification path to ensure each amplifier is operating in a linear region for the given signal level. For amplifier configurations having multiple amplification stages, the bias circuitry provides proportional bias currents to each stage as necessary for the progressively increasing signal levels. The bias circuitry automatically increases bias currents only as needed to eliminate excessive quiescent bias currents that prior biasing techniques required to ensure linear operation.

The bias circuitry may be constructed using traditional bipolar and BiCMOS technology while the power amplifier may incorporate gallium arsenide (GaAs) heterojunction bipolar transistor (HBT) or MESFET technology, as well as traditional silicon-based technology. The GaAs HBT and MESFET technology allows for the design of very efficient amplifier circuitry, but is very expensive and often sensitive to temperature and the manufacturing process. Preferably, the biasing circuitry incorporates the more traditional bipolar and BiCMOS technology, which is inexpensive, easy to manufacture, and stable over temperature variations, while the amplifier circuitry incorporates the more expensive and efficient semiconductor technologies. Although the amplification circuitry may include traditional silicon-based technologies, the present invention allows implementation of different technologies in a single chip set to provide improved performance at a relatively low cost.

These and other aspects of the present invention will become apparent to those skilled in the art after reading the following description of the preferred embodiments when considered with the drawings.

BRIEF DESCRIPTION OF THE DRAWING FIGURES

DETAILED DESCRIPTION OF THE INVENTION

Figure 1:
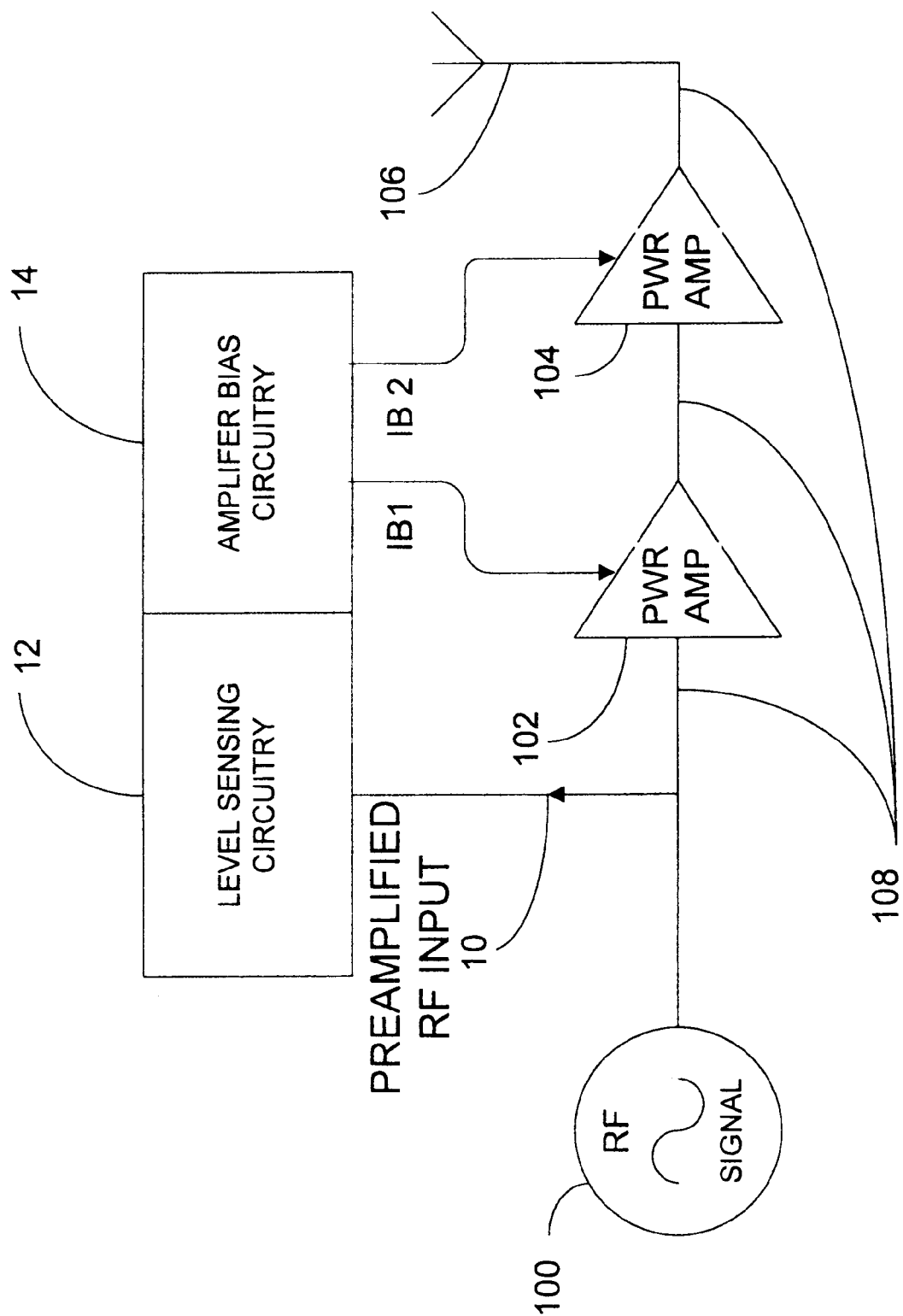
FIG. 1 is a block schematic providing a general overview of the biasing circuit of the present invention operating in conjunction with a multi-stage radio frequency power amplifier.

In the following description, like reference characters designate like or corresponding elements throughout the several views.

Figure 2:
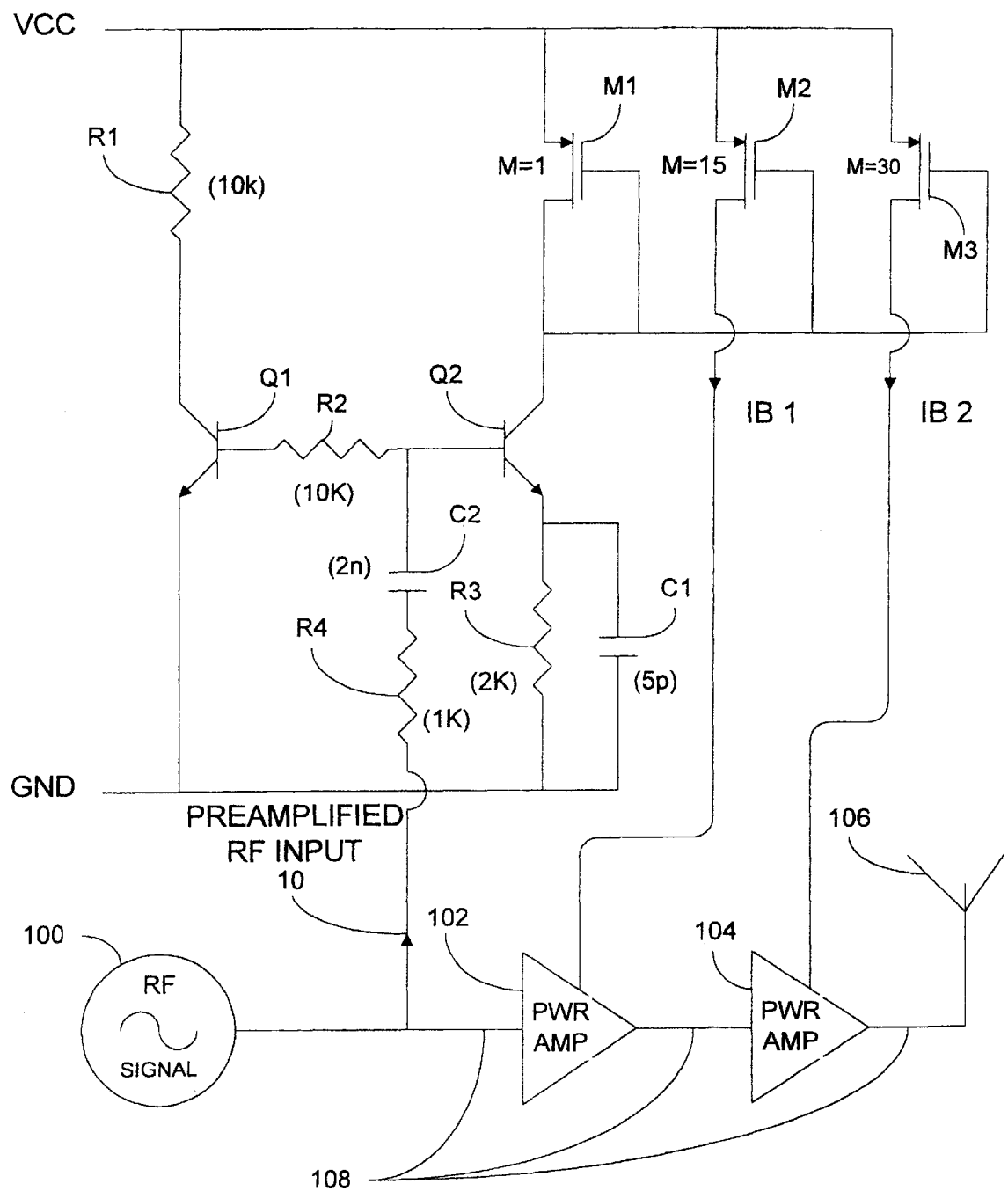
FIG. 2 is a more detailed schematic of the preferred embodiment of the biasing circuitry of the present invention as configured for a multi-stage power amplifier.

Referring now to the drawings in general, and FIGS. 1 and 2 in particular, it should be understood that the illustrations are for the purpose of describing a preferred embodiment of the invention and are not intended to limit the invention thereto. The schematics are simplified in order to promote understanding of the present invention. Those of ordinary skill in the art will be able to implement the designs based on the simplified schematics. Furthermore, the bias circuitry may include components not shown in the schematics, and like the power amplifier circuitry, all components in the circuitry may be embodied within an integrated circuit substrate. For example, although not depicted, the power amplifier circuitry as well as the bias circuitry discussed herein may include any number of active diodes, capacitors and resistors in the final design. The bias circuitry and power amplifiers discussed herein are particularly suited for wireless communication applications, but other applications will be readily apparent to those of skill in the art.

As best seen in FIG. 1, an RF signal 100 is generated in a wireless communications device for transmission. The RF signal is amplified, sequentially by first and second power amplifier stages 102, 104 and transmitted via antenna 106. The signal path along which the RF signal travels for amplification and transmission is generally referred to as the amplification path 108. The power amplifier stages 102 and 104 are transistor based, and preferably incorporate GaAs HBT or MESFET technology, however, traditional silicon-based amplifiers benefit from the present invention as well.

An RF input 10 couples a portion of the amplification path to level sensing circuitry 12 prior to any amplifier or amplification stage. The level sensing circuitry 12 senses the effective level or magnitude of the preamplified RF signal and provides dynamic control to the amplifier bias circuitry 14. According to the level of the RF signal to be amplified, the amplifier bias circuitry 14 provides a first bias current IB 1 to the first power amplifier stage 102 and a second bias current IB 2 to the second power amplifier stage 104. The bias currents IB 1 and IB 2 are automatically adjusted based on the preamplified RF signal. Because subsequent power amplifier stages, such as stage 104, operate over larger signal level ranges than preceding stages, such as stage 102, bias currents must be increased as necessary for each succeeding stage in the amplification path 108.

With reference now to FIG. 2, a more detailed schematic of the preferred embodiment of the invention is shown. Although the amplification circuitry and bias circuitry may be configured to operate at virtually any radio frequency, this particular embodiment is configured to operate between 1800 and 1900 MHz. In a preferred embodiment, the amplification circuitry consists of a two-stage, 20 decibel (dB) gain power amplifier driver. Notably, the bias circuitry and amplification circuitry may be incorporated in a single integrated circuit, separate circuits, or a combination of integrated discrete components. For the sake of conciseness and readability, the bias circuit shown in FIG. 2 is shown only controlling bias currents with respect to the RF input signal to be amplified. In operation, the bias circuitry may be combined with other circuitry that may impact bias control to compensate for temperature, gain or other operation aspect.

In operation, the bias circuitry senses the strength of the input signal to be amplified and converts it to a DC current. The DC current is then mirrored to form bias currents for one or more amplifiers or amplifier stages. Transistors Q1 and Q2 along with resistors R1 and R3 are configured to provide a minimum DC bias condition when the input signals are small. In this mode, the current flowing through transistor Q2 is small and the corresponding bias currents are also small. As the input signal increases in magnitude, transistor Q2 effectively amplifies and rectifies the input signal, and capacitor C2 and resistor R3 operate to filter the rectified input signal. The DC current flowing through transistor Q2 is directly proportional to the input signal level to be amplified.

In particular, transistor Q2 will conduct as the input signal received at the base cycles above the voltage appearing at the emitter of transistor Q2. If the input signal level surpasses the emitter voltage at transistor Q2, the transistor will conduct and charge capacitor C1 to a higher voltage. If the input signal level does not surpass a voltage sufficient to cause transistor Q2 to conduct, the emitter voltage held by capacitor C1 will discharge through resistor R3 until an input signal level surpasses the emitter voltage sufficient enough to turn on transistor Q2. Thus, transistor Q2 and the filter network composed of resistor R3 and C1 effectively rectify the input signal.

In addition to rectifying the input signal, transistor Q2 operates as an amplifier wherein the current through Q2 is set by the rectified voltage level appearing at the emitter and the value of resistor R3. As the emitter voltage increases, the amount of current through transistor Q2 increases. Transistor Q2 is supplied current via a PMOS transistor M1. The gate and source of transistor M1 are coupled to the collector of the PMOS transistor M1. Preferably, transistor M1 has a current gain ratio of 1. Thus, the current flowing through M1 is equal to the current flowing through transistor Q2.

Additional PMOS transistors M2 and M3 are coupled to transistors M1 and Q2 to form current mirrors, which proportionally mirror the current flowing through transistor M1. The current mirrors are configured to have current gains sufficient to appropriately bias the respective amplifier or amplifier stage to ensure linearity for the corresponding signal levels. In the embodiment shown in FIG. 2, if transistor M1 has a unity current gain, transistor M2 will provide a current gain of 15 times that flowing through transistor M1, and transistor M3 will have a current gain of 30 times that of transistor M1.

The gates of PMOS transistors M2 and M3 are coupled to the collector of transistor Q2 wherein the collector voltage of Q2 controls the current through each PMOS transistor M1, M2 and M3. The current through transistor M1 supplies the current for transistor Q2 and the current supplied by transistors M2 and M3 provide the respective bias currents IB1 and IB2. For example, if the DC current flowing through transistor Q2 is approximately 100 microamps, the current flowing through transistor M1 would also be 100 microamps, while the current flowing through transistors M2 and M3 would be 1.5 milliamps and 3.0 milliamps, respectively. Additional current mirrors and amplification stages may be added as necessary.

Resistor R4 and capacitor C2 may be used to adjust the sensitivity of the input to the bias circuitry and block DC. Adjusting the resistance of R4 will effectively adjust the transconductance of the bias circuitry.

Figure 3:
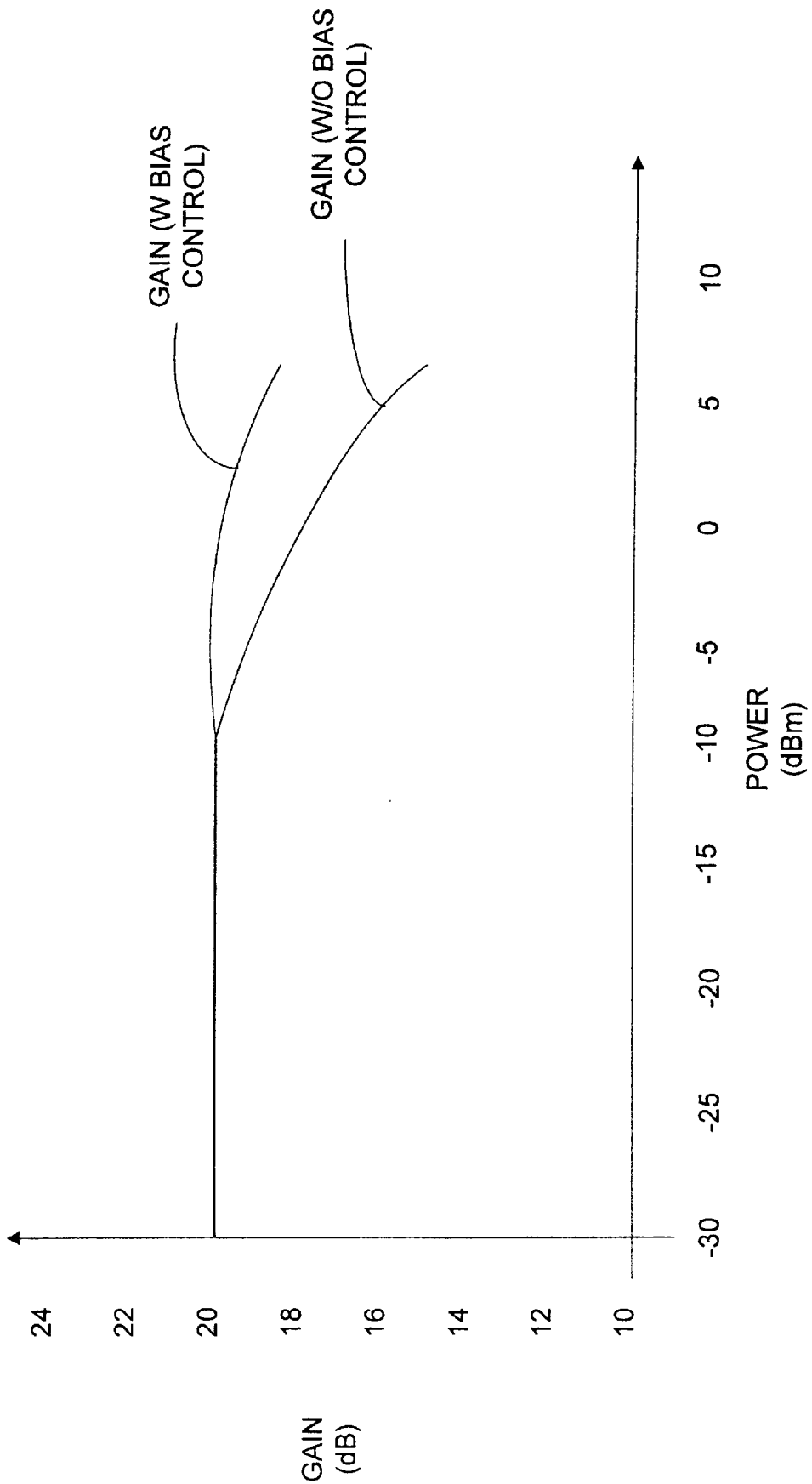
FIG. 3 is a graph of amplifier performance for an RF amplifier with and without biasing provided by the bias circuitry depicted in FIG. 2.
Figure 4:
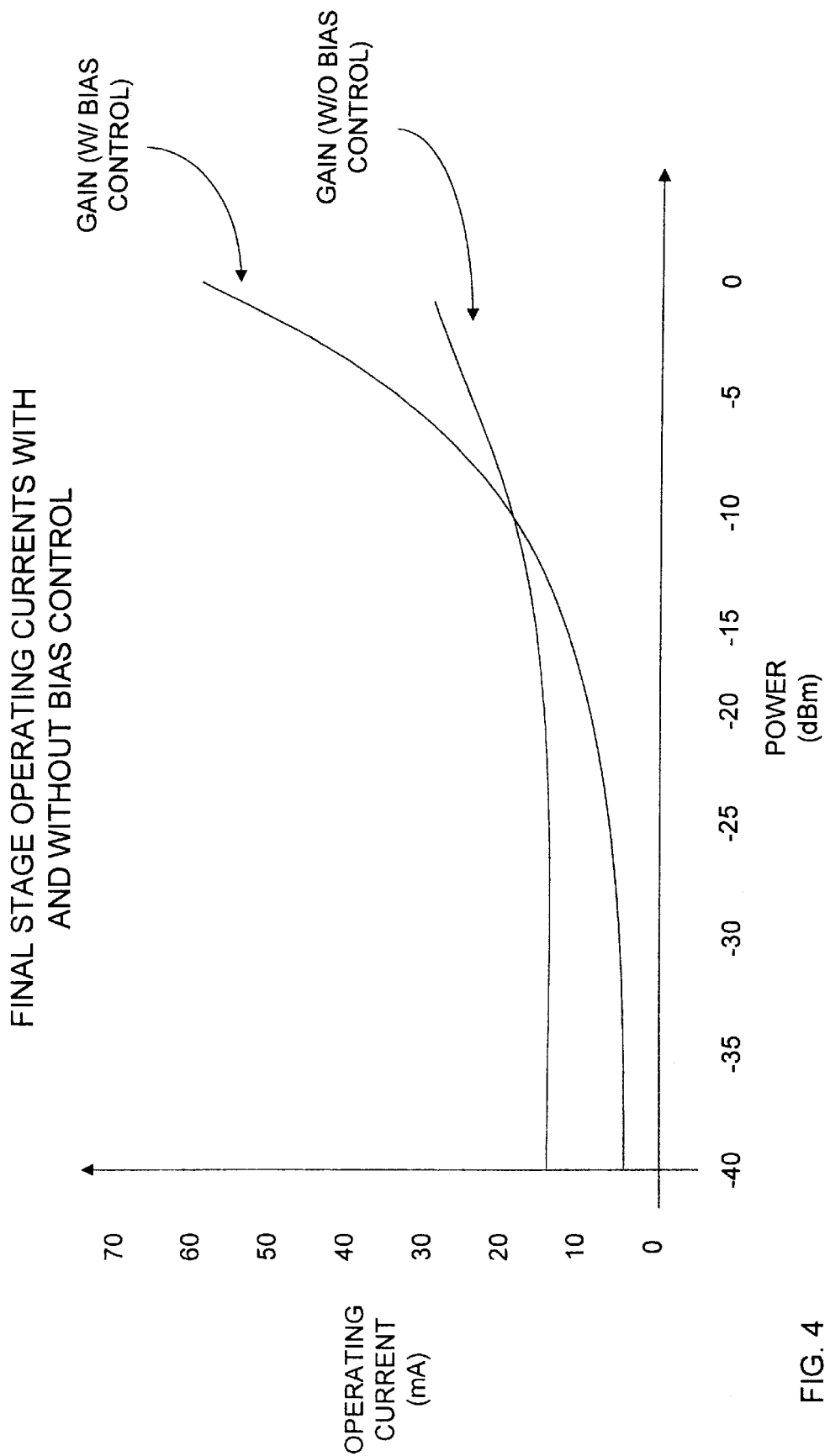
FIG. 4 is a graph of final stage collector currents for amplifier circuitry using bipolar technology with and without biasing provided by the bias circuitry depicted in FIG. 2.

The graph of FIG. 3 depicts the improved performance of a power amplifier when the bias control circuitry of the present invention is used to bias the power amplifier stages 102, 104. As is clearly shown, gain is linear over a wider operating range when the inventive circuitry is used. The graph of FIG. 4 depicts amplifier gain versus operating current of an amplifier stage with and without the biasing circuitry. Note there is significant power savings over most of the operating range and significant increases in gain at maximum operating levels. Under small signal conditions, quiescent currents are much lower when automatic bias control is provided. At the same time, the automatic bias control extends the linear operating range under large signal conditions. Testing of the preferred embodiment has shown that at low power levels, operating currents are cut approximately in half, which effectively doubles amplifier efficiency. At larger input power levels, bias currents are automatically increased past normal operating levels to allow a 6 dB increase in output power without compromising linearity.

Figure 5:
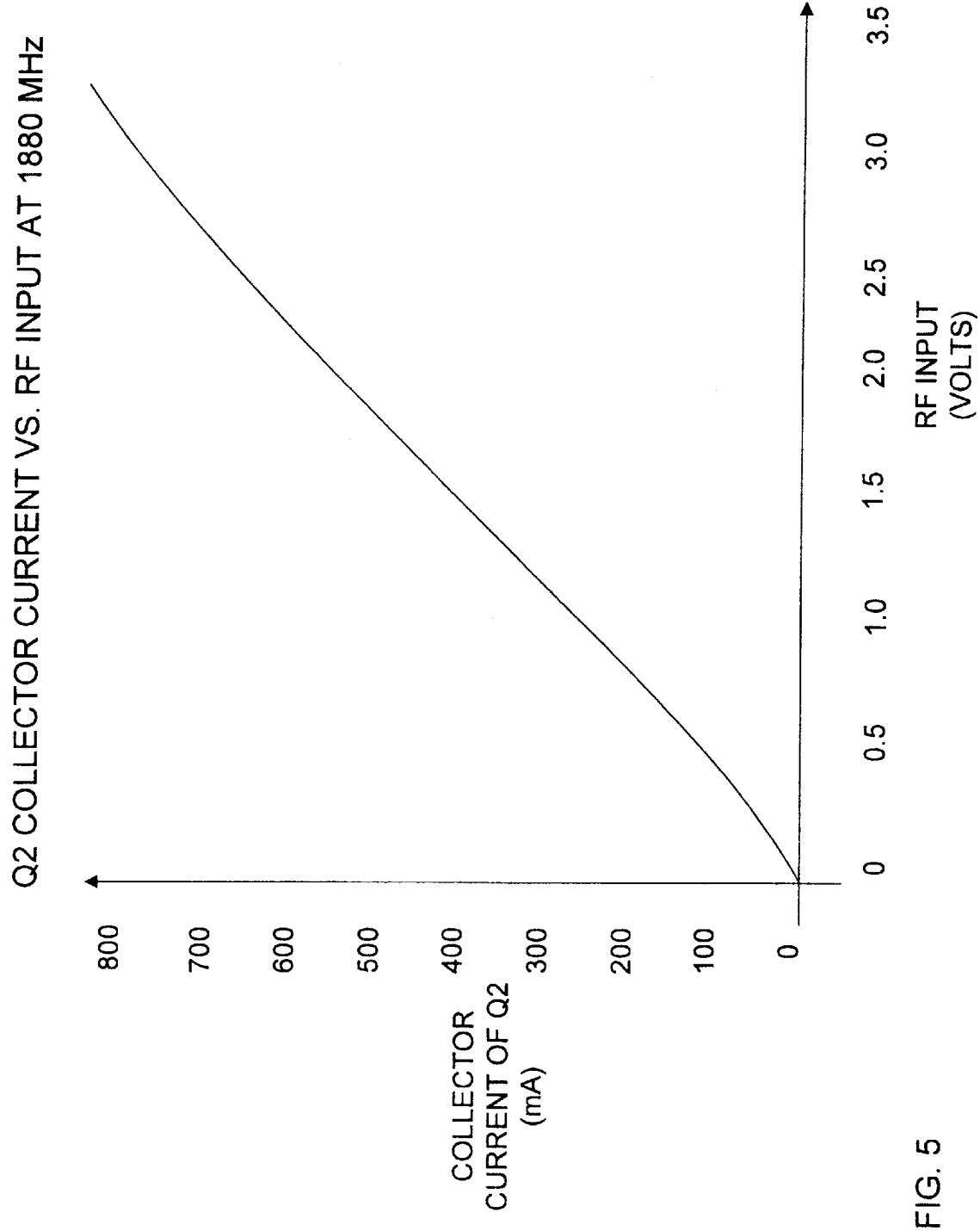
FIG. 5 is a graph of the collector current of transistor Q2 depicted in FIG. 2 versus an RF input signal to be amplified.

The graph of FIG. 5 shows the linear transfer function of the bias circuitry. As the RF input voltage is swept from 0 to 3 volts, the current flowing through transistor Q2 substantially, linearly sweeps from 18 microamps to 828 microamps. The linearity of the bias current generators, namely transistors M2 and M3 in the preferred embodiment, mirrors that of the current flowing through transistor Q2.

Certain modifications and improvements will occur to those skilled in the art upon reading the foregoing description. It should be understood that all such modifications and improvements have been deleted herein for the sake of conciseness and readability but are properly which the scope of the following claims.

What is claimed is:

1. A biasing circuit for use with at least two radio frequency power amplifiers in an amplification signal path, said biasing circuit comprising:

a. an input for receiving a radio frequency signal to be amplified in the amplification signal path;

b. a first transistor circuit coupled to said input and adapted to provide a bias control output based on a relative magnitude of the radio frequency signal to be amplified; and c. a biasing network including a network of bias transistors in a current mirror configuration adapted to receive the bias control output and provide a biasing output for each of the at least two power amplifiers in the amplification signal path proportional to the bias control output, said biasing outputs configured to provide proportionally larger bias currents for successive ones of said at least two radio frequency power amplifiers;

d. wherein the magnitude of a radio frequency signal to be amplified is used to provide a proportional bias to the at least two power amplifiers sufficient to ensure substantially linear operation of each power amplifier over varying levels of the radio frequency signal to be amplified.

2. The biasing circuit of claim 1 wherein said level sensing circuitry is implemented with BiCMOS technology and the power amplifier is implemented with one of the group consisting of GaAs heterojunction bipolar transistors, field effect transistors, MOSFET's, and MESFETs.

3. A biasing circuit for at least two radio frequency power amplifier stages in an amplification signal path, said biasing circuit comprising:

a. an input for receiving a radio frequency signal to be amplified in the amplification signal path;

b. a bipolar transistor network having an emitter coupled to a filter network, a base coupled to said input, and a collector;

c. a first field effect transistor having a first current gain coupled to said collector and adapted to provide current to said bipolar transistor network;

d. a second field effect transistor coupled to said collector of said bipolar transistor network and said first field effect transistor having a second current gain to provide a first bias current for a first amplifier stage in the amplification path, said first bias current mirroring said current provided to the bipolar transistor network; and e. a third field effect transistor coupled to said collector of said bipolar transistor network and said first field effect transistor having a third current gain to provide a second bias current for a second amplifier stage in the amplification path, said second bias current mirroring said current provided to the bipolar transistor network;

f. wherein said bias currents are sufficient to ensure substantially linear operation of the respective power amplifier stages over varying levels of the radio frequency signal to be amplified.

4. The biasing circuit of claim 3 wherein said first, second and third field effect transistors are P-channel MOSFETs.

5. The biasing circuit of claim 3 wherein said first field effect transistor has first gain., said second field effect transistor has a second gain higher than said first field effect transistor gain and said third field effect transistor has a third gain higher than said second field effect transistor gain.

6. The biasing circuit of claim 3 further including a second bipolar transistor having an emitter coupled to ground, a base coupled to said input and said base of said first bipolar transistor through a resistor, and a collector coupled to a power source through a second resistor and said base of said second bipolar transistor, said filter network including a resistor and capacitor coupled in parallel between said emitter of said first bipolar transistor and ground, said field effect transistor coupled to the power source.

7. The biasing circuit of claim 3 wherein said biasing circuit is integrated in an integrated circuit.

8. The biasing circuit of claim 3 wherein said circuit includes at least a portion of said amplification path and said power amplification stages, said power amplification stages primarily composed of GaAs heterojunction bipolar transistors.

9. The biasing circuit of claim 8 wherein said biasing circuit and said amplification stages are integrated in a single integrated circuit.

10. The biasing circuit of claim 3 wherein said circuit includes at least a portion of said amplification path and said power amplification stages, said power amplification stages primarily composed of field effect transistors.

11. The biasing circuit of claim 10 wherein said biasing circuit and said amplification stages are integrated in a single integrated circuit.

12. The biasing circuit of claim 3 wherein said field effect transistors in said power amplification stages are MOSFETs.

13. The biasing circuit of claim 3 wherein said field effect transistors in said power amplification stages arc MESFETs.

14. A biasing circuit for at least two radio frequency power amplifiers in an amplification signal path, said biasing circuit comprising:

a. a sensing input coupled to the amplification signal path prior to the power amplifier;

b. level detection and filter circuitry coupled to said sensing input and adapted to provide an output proportional to a maximum level of a radio frequency input signal appearing at the sensing input on the amplification signal path; and c. a current source coupled to said level detection circuitry and adapted to provide a bias current to each one of the at least two power amplifiers, each said bias current being proportional to said output and said level of the radio frequency signal to be amplified, and wherein a second bias current provided to a second one of the at least two power amplifiers is proportionally larger than a first bias current provided to a first one of the at least two power amplifiers such that said first one receives a lower bias current than said second one;

d. wherein said biasing circuit senses the magnitude of a radio frequency signal to be amplified and provides said proportional bias currents to the at least two power amplifiers sufficient to ensure linear operation of the power amplifiers over varying levels of the radio frequency signal to be amplified.

15. A biasing circuit for successive radio frequency power amplifiers in an amplification signal path, said biasing circuit comprising:

a. an input for receiving a radio frequency signal to be amplified in the amplification signal path;

b. level sensing and biasing circuitry adapted to monitor a relative magnitude of the radio frequency signal to be amplified and provide biasing outputs for biasing the successive power amplifiers in the amplification signal path proportional to the relative magnitude of the radio frequency signal, said level sensing and biasing circuitry comprising, i. a first transistor circuit driven by the radio frequency signal to be amplified via said input and configured to effectively rectify the radio frequency signal to be amplified, and provide a control current for controlling said biasing outputs; and ii. a bias output transistor circuit for each of said successive power amplifiers, each said bias output transistor circuit coupled to said first transistor circuit and adapted to provide a biasing current to a corresponding one of said successive power amplifiers based on said control current, wherein a current gain of each of said bias output transistor circuits is configured based on a relative signal amplitude amplified by said corresponding one of said successive power amplifiers;

c. wherein said sensing and biasing circuitry monitors the magnitude of a radio frequency signal to be amplified and provides a proportional bias to each of the successive power amplifiers sufficient to ensure linear operation of the successive power amplifiers over varying levels of the radio frequency signal to be amplified.

16. A biasing circuit for a radio frequency power amplifier in an amplification signal path, said biasing circuit comprising:

a. an input for receiving a radio frequency signal to be amplified in the amplification signal path;

b. a bias current generator providing a variable bias current to the power amplifier in said amplification signal path; and c. a bipolar transistor having an emitter coupled to a filter network, a base coupled to said input, and a collector coupled to said bias current generator to control said variable bias current, said bipolar transistor and filter configured to effectively rectify the radio frequency signal to be amplified and control said bias current proportional to the rectified level of the radio frequency signal to be amplified;

d. wherein bias current is sufficient to ensure linear operation of the power amplifier over varying levels of the radio frequency signal to be amplified.

17. The biasing current of claim wherein said collector of said bipolar transistor is coupled to a field effect transistor configured to operate in cooperation with and supply current to said bipolar transistor.

18. The biasing current of claim 16 wherein said bias generator includes field effect transistor effectively driven by said collector of said bipolar transistor to provide said bias current.

19. he biasing current of claim 16 wherein said bias generator is configured as a current mirror adapted to mirror proportional levels of current drawn by said bipolar transistor as a bias current for the power amplifier.

20. The biasing current of claim 19 wherein said current mirror provides a second bias current, which is proportional to said bias current, to a second power amplifier in the amplification path.

21. A biasing circuit for a radio frequency power amplifier stage in an amplification signal path, said biasing circuit comprising:

a. an input for receiving a radio frequency signal to be amplified in the amplification signal path;

b. a bipolar transistor network having an emitter coupled to a filter network, a base coupled to said input, and a collector;

c. a first current source coupled to said collector and adapted to provide current to said bipolar transistor network; and d. a current mirror coupled to said collector of said bipolar transistor network and said first current source to provide a bias current for the amplifier stage in the amplification path;

e. said bipolar transistor and filter network configured to effectively rectify the radio frequency signal to be amplified and control said bias current proportional to the rectified level of the radio frequency signal to be amplified;

f. wherein said bias current is sufficient to ensure substantially linear operation of the power amplifier over varying levels of the radio frequency signal to be amplified.

22. The biasing circuit of claim 21 wherein the amplification path has at least two power amplifiers in the amplification path and said biasing circuit includes a second current mirror coupled to said collector of said bipolar transistor network and said first current source to provide a second bias current for a second amplifier stage in the amplification path.

23. The biasing circuit of claim 22 wherein said first current mirror has a current gain lower than a current gain for the second current mirror.

24. The biasing circuit of claim 23 wherein said current mirrors and said first current source are field effect transistors.

25. The biasing circuit of claim 22 wherein said current mirrors and said first current source are P-channel MOSFETs.

26. The biasing circuit of claim 22 wherein said current mirrors and said first current source are configured to have different current gains, said current source having the least gain and said second current mirror having the greatest gain.

27. A method for biasing two or more successive radio frequency power amplifier stages in an amplification signal path, said method comprising:

a. receiving a radio frequency signal to be amplified in the amplification signal path;

b. rectifying the received radio frequency signal;

c. providing a first current proportional to a level of the rectified radio frequency signal; and d. mirroring a bias current for each of the two or more successive power amplifier stages proportional to the first current to provide a bias for each power amplifier stage in the amplification path, wherein the bias currents are mirrored with differing current gains configured such that later power amplifier stages receive proportionally larger bias currents than earlier power amplifier stages in the amplification signal path;

e. wherein the bias currents are sufficient to ensure linear operation of each successive power amplifier stage over varying levels of the radio frequency signal to be amplified.

28. A biasing circuit for biasing at least first and second radio frequency power amplifier stages in an amplification signal path, said biasing circuit comprising:

a. means for receiving a radio frequency signal to be amplified in the amplification signal path;

b. means for rectifying the received radio frequency signal;

c. means for providing a first current proportional to a level of the rectified radio frequency signal; and d. means for mirroring first and second bias currents proportional to the first current to provide a bias for the at least first and second power amplifier stages in the amplification path;

e. wherein the first and second bias currents are sufficient to ensure linear operation of the at least first and second power amplifier stages over varying levels of the radio frequency signal to be amplified, and further wherein said second bias current is proportionally larger than said first bias current and sufficient to ensure linear operation of the second power amplifier stage over varying levels of the radio frequency signal to be amplified.

29. A biasing circuit for use with at least two radio frequency power amplifiers in an amplification signal path, said biasing circuit comprising:

a. a means for receiving a radio frequency signal to be amplified in the amplification signal path;

b. a means for monitoring a relative magnitude of the radio frequency signal to be amplified; and c. a means for mirroring a bias current to each of the at least two power amplifiers in the amplification signal path proportional to the relative magnitude of the radio frequency signal, and wherein a magnitude of each bias current is further based on where in the amplification signal path a corresponding one of the at least two power amplifiers is disposed, such that each successive power amplifier receives a proportionately larger bias current;

d. wherein the magnitude of the radio frequency signal to be amplified is used to provide a proportional bias to the at least two power amplifiers sufficient to ensure substantially linear operation of each power amplifier over varying levels of the radio frequency signal to be amplified.

* * * * *